United States Patent
Park et al.

(10) Patent No.: US 7,479,818 B2
(45) Date of Patent: Jan. 20, 2009

(54) SENSE AMPLIFIER FLIP FLOP

(75) Inventors: Min-Ho Park, Daejeon (KR); Young-Soo Sohn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 52 days.

(21) Appl. No.: 11/552,102

(22) Filed: Oct. 23, 2006

(65) Prior Publication Data

US 2007/0182458 A1    Aug. 9, 2007

(30) Foreign Application Priority Data

Feb. 3, 2006    (KR) ...................... 10-2006-0010881

(51) Int. Cl.
*H03K 3/00* (2006.01)

(52) U.S. Cl. ...................... 327/218; 327/534

(58) Field of Classification Search ................. 438/46; 327/218, 534
See application file for complete search history.

(56) References Cited

U.S. PATENT DOCUMENTS

| 6,232,810 | B1 * | 5/2001 | Oklobdzija et al. | ......... 327/217 |
| 6,336,113 | B1 | 1/2002 | Yoneda et al. | |
| 6,653,890 | B2 * | 11/2003 | Ono et al. | ...................... 327/537 |
| 6,714,053 | B2 * | 3/2004 | Mohan | ........................ 327/65 |
| 6,807,118 | B2 * | 10/2004 | Perner | ........................ 365/209 |

FOREIGN PATENT DOCUMENTS

| JP | 2004-039231 | 2/2004 |
| KR | 1999-003041 | 1/1999 |
| KR | 1999-0038009 | 6/1999 |
| KR | 10-0355277 | 9/2002 |
| KR | 10-2005-0053993 | 6/2005 |
| KR | 10-2005-0096607 | 10/2005 |

OTHER PUBLICATIONS

English language abstract for Korean Publication No. 1999-0038009.
English language abstract for Korean Publication No. 10-0355277.
English language abstract for Japanese Publication No. 2004-039231.
English language abstract for Korean Publication No. 1999-0038009.
English language abstract for Korean Publication No. 10-0355277.
English language abstract for Japanese Publication No. 2004-039231.

* cited by examiner

*Primary Examiner*—Kenneth B Wells
*Assistant Examiner*—John W Poos
(74) *Attorney, Agent, or Firm*—Marger Johnson & McCollom, P.C.

(57) ABSTRACT

A sense amplifier flip flop including a differential input portion, a differential amplifying portion including a first inverter and a second inverter, and a bias voltage generating portion. The bias voltage generating portion is configured to generate body voltages for transistors of the first inverter and the second inverter so that an offset between electric currents flowing through the differential input portion can be adjusted.

17 Claims, 8 Drawing Sheets

SENSE AMPLIFIER FLIP FLOP

CROSS-REFERENCE TO RELATED APPLICATION

This application claims the benefit of Korean Patent Application No. 2006-0010881, filed Feb. 3, 2006, the disclosure of which is hereby incorporated herein by reference in its entirety.

BACKGROUND

1. Technical Field

This disclosure relates to a sense amplifier flip flop and, more particularly, to a sense amplifier flip flop which adjusts an offset.

2. Description of the Related Art

A system which performs an input or output operation at high speeds has many important parts. However, an input/output portion is one of the parts which critically affect a performance of the system. Among such an input/output portion, a flip flop exactly receives an input signal and samples it.

A semiconductor memory device such as a dynamic random access memory (DRAM) or a static random access memory (SRAM) includes a data input buffer which detects an externally input data signal and buffers it at a predetermined level for matching logic levels within its memory cells and a latch which continuously maintains data input from an external portion until the data is transmitted to the memory cell.

FIG. 1 is a circuit diagram illustrating a first conventional sense amplifier flip flop. A pre-charging portion 10 includes a PMOS transistor P1 connected between a power voltage Vdd and a first node Node1 and a PMOS transistor P2 connected between a power voltage Vdd and a second node Node2. The PMOS transistors P1 and P2 receive a clock signal CLK through their gates and are turned on to pre-charge the first and second nodes Node1 and Node2 when the clock signal CLK having a low level is applied, respectively.

A differential input portion 20 includes an NMOS transistor N1 which is connected between a common node NodeC and a ground voltage Vss and serves as a switch for driving the differential input portion 20 in response to the clock signal CLK, an NMOS transistor N2 connected between a third node Node3 and the common node NodeC to receive an input signal D, and an NMOS transistor N3 connected between a fourth node Node4 and the common node NodeC to receive an inverted input signal DB. When the clock signal having a high level is applied, the NMOS transistor N1 is turned on, so that the differential input portion 20 receives the input signal D and the inverted input signal DB, respectively, through the NMOS transistors N2 and N3 to detect a voltage difference between the input signal D and the inverted input signal DB.

A differential amplifying portion 30 includes two inverters, i.e., first and second inverters 30-1 and 30-2 respectively connected between the power voltage Vdd and the third and fourth nodes Node3 and Node4. An input of the first inverter 30-1 is connected to the node Node2, and an input of the second inverter 30-2 is connected to the first node Node1.

The differential amplifying portion 30 amplifies the voltage difference between the input signal D and the inverted input signal DB, detected by the differential input portion 20, to output a differential signal Mout and an inverted differential signal MoutB respectively to the first and second nodes Node1 and Node2.

A latch portion 40 includes two NAND gates 40-1 and 40-2. The first NAND gate 40-1 receives the differential signal Mout and an inverted output signal QB, i.e., an output of the second NAND gate 40-2 to output an output signal Q, and the second NAND gate 40-2 receives the inverted differential signal MoutB and an output signal Q, i.e., an output of the first NAND gate 40-1 to output an inverted output signal QB.

The latch portion 40 latches the differential signal Mout and the inverted differential signal MoutB as an SR latch to output the output signal Q and the inverted output signal QB.

TABLE 1

| CLK(L) | D | Mout | MoutB | Q |
|---|---|---|---|---|
| | X | 1 | 1 | Hold |
| CLK(H) | H | 0 | 1 | 0 |
| | L | 1 | 0 | 1 |

Table 1 is a truth table of the sense amplifier flip flop of FIG. 1. An operation of the sense amplifier flip flop is described below with reference to FIG. 1 and Table 1. When the clock signal CLK having a low level is applied, the PMOS transistors P1 and P2 of the pre-charging portion 10 are turned on, and the NMOS transistor N1 of the differential input portion 20 is turned off. As a result, the power voltage Vdd is applied to the first and second nodes Node1 and Node2, and the differential signal Mout and the inverted differential signal MoutB, each having a high level are applied to the latch portion 40. The latch portion 40 by the nature of the SR latch maintains the output signal Q and the inverted output signal QB "as is" in a previous state when the differential signal Mout and the inverted differential signal MoutB both have a high level. At the same time, the pre-charging portion 10 pre-charges the first and second nodes Node1 and Node2.

When the clock signal CLK having a high level is applied, the PMOS transistors P1 and P2 of the pre-charging portion 10 are turned off, and the NMOS transistor N1 of the differential input portion 20 is turned on.

When the input signal D having a high level is applied to the differential input portion 20, the NMOS transistor N2, which receives the input signal D, is turned on, and the NMOS transistor N3, which receives the inverted input signal DB, is turned off.

When the NMOS transistor N2 of the differential input portion 20 is turned on, since the first and second nodes Node1 and Node2 have been pre-charged, the NMOS transistor N4 of the first inverter 30-1 of the differential amplifying portion 30 is also turned on. As a result, a voltage level of the first node Node1 is lowered. When the voltage level of the first node Node1 is lowered, the PMOS transistor P3 is turned off. As a result, the differential signal Mout transitions to a low level, and is output to the latch portion 40.

In contrast, the NMOS transistor N3 of the differential input portion 20 and the NMOS transistor N5 of the second inverter 30-2 are turned off, and the PMOS transistor P4 is turned on. As a result, the second node Node2 is maintained at a pre-charged voltage level, and the inverted differential signal MoutB transitions to a high level and is output to the latch portion 40.

The latch portion 40 outputs the output signal Q having a low level and the inverted output signal QB having a high level when the differential signal Mout transitions to a low level and the inverted differential signal MoutB transitions to a high level.

When the input signal D having a low level is applied to the differential input portion 20, the NMOS transistor N2, which receives the input signal D, is turned off, and the NMOS transistor N3, which receives the inverted input signal DB, is turned on.

When the NMOS transistor N3 of the differential input portion 20 is turned on, since the first and second nodes Node1 and Node2 have been pre-charged, the NMOS transistor N5 of the second inverter 30-2 of the differential amplifying portion 30 is also turned on. As a result a voltage level of the second node Node2 is lowered. When the voltage level of the second node Node2 is lowered, the PMOS transistor P4 is turned off, so that the inverted differential signal MoutB transitions to a low level and then is output to the latch portion 40.

In contrast, the NMOS transistor N2 of the differential input portion 20 and the NMOS transistor N4 of the first inverter 30-1 are turned off, and the PMOS transistor P3 is turned on. As a result, the first node Node1 is maintained at the pre-charged voltage level, and the differential signal Mout transitions to a high level and is output to the latch portion 40.

The latch portion 40 outputs the output signal Q having a high level and the inverted output signal QB having a low level when the differential signal Mout transitions to a high level and the inverted differential signal MoutB transitions to a low level.

That is, the first and second inverters 30-1 and 30-2 of the differential amplifying portion 30 are connected such that the inputs crosses the outputs of the other inverter and thus amplify and output a small voltage difference applied from the differential input portion 20.

The sense amplifier flip flop of FIG. 1 has a structure including a master including the pre-charging portion 10, the differential input portion 20, and the differential amplifying portion 30 and a slave latch including of the latch portion 40. There is an advantage in that the master is configured in the form of a differential amplifier and is capable of handling a signal level having small magnitude, and the slave latch can perform a stable high speed operation and thus can process an input signal level having small magnitude at a high speed.

However, there is a disadvantage in that a voltage offset may occur as well. Such an offset may occur as a result of a processing error, a layout error, or mismatching of a threshold voltage Vth in the NMOS transistor.

FIG. 2 is a circuit diagram illustrating a second conventional sense amplifier flip flop. The sense amplifier flip flop of FIG. 2 includes multiple capacitors as a solution for resolving the offset problem. Capacitors C11 to C13 and C21 to C23 are respectively connected to the third and fourth nodes Node3 and Node4 to control an electric current which flowing from the differential amplifying portion 30 to the differential input portion 22 to thereby adjust the offset.

When the input signal D and the inverted input signal DB each have a high level, there should be no voltage difference between the two signals D and DB. As a result, there should be no difference in the electric current which flows from the NMOS transistor N4 through the third node Node3 as compared with the electric current which flows from the NMOS transistor N3 through the fourth node Node4.

However, if it is assumed that an electric current $I+I_{offset}$ which flows through the fourth node Node4 is greater than an electric current I which flows through the third node Node3 by the offset current $I_{offset}$, the offset current $I_{offset}$ is a cause of errors when the input signal is determined and thus should be offset.

To this end, a predetermined number of capacitors among the capacitors C21 to C23 are connected to the fourth node Node4, enough to offset the offset current $I_{offset}$ from the current $I+I_{offset}$ which flows through the fourth node Node4. The remaining capacitor(s) and the capacitors C11 to C13 connected to the third node Node3 are disconnected by fuse cutting. For example, if the offset current offset is offset by the capacitor 21, the remaining capacitors C11 to C13, C22, and C23 are disconnected by fuse cutting.

FIG. 3 is a circuit diagram illustrating a third conventional sense amplifier flip flop. In FIG. 3, as a method for resolving the offset problem, NMOS transistors N2, N21, N22, N3, N31, and N32 are arranged in the differential input portion 24.

The sense amplifier flip flop of FIG. 2 reduces the offset current $I_{offset}$ to adjust the offset, whereas the sense amplifier flip flop of FIG. 3 allows the current I flowing through the third node Node3 to increase by the offset current $I_{offset}$ to adjust the offset.

If it is assumed that an electric current $I+I_{offset}$, which flows through the fourth node Node4, flows by the offset current $I_{offset}$ more than an electric current (I), which flows through the third node Node3, as in FIG. 2, a predetermined number of NMOS transistors are remain connected to allow a greater electric current to flow to the NMOS transistor N2 side connected to the third node Node3. The remaining NMOS transistors are disconnected by fuse cutting.

For example, if an additional electric current that is as much as the offset current $I_{offset}$ flows to the third node Node3 due to the NMOS transistor N21, the remaining transistors N22, N31, and N32 are disconnected by fuse cutting.

Similarly to the circuit of FIG. 3, If it is assumed that an electric current $I+I_{offset}$, which flows through the fourth node Node4, flows by the offset current $I_{offset}$ more than an electric current (I), which flows through the third node Node3, it is possible to make an electric current flow more to the NMOS transistor N2 side by increasing the size of the NMOS transistor N2.

Unfortunately, in adjusting the offset of the sense amplifier flip flops shown in FIGS. 2 and 3, multiple capacitors or transistors are required, and thus there is a disadvantage in that it is not easy to design and the layout area size of the sense amplifier flip flop is increased. In addition, a process for blowing off the fuses to adjust the offset is needed.

SUMMARY

It is an object of the present invention to provide a sense amplifier flip flop which easy adjusts the offset.

One aspect of the present invention is to provide a sense amplifier flip flop, comprising: a pre-charging portion connected between a first power voltage and first and second nodes and pre-charging the first and second nodes to a predetermined voltage in response to a clock signal, a differential input portion connected between a second power voltage and third and fourth nodes and receiving an input signal and an inverted input signal to generate a voltage difference between the input signal and the inverted input signal to the third and fourth nodes in response to the clock signal, a differential amplifying portion including a first inverter which includes a first pull-up transistor and a first pull-down transistor serial-connected between the first power voltage and the third node and inverts a signal of the second node to be outputted to the first node and a second inverter which includes a second pull-up transistor and a second pull-down transistor serial-connected between the first power voltage and the fourth node and inverts a signal of the first node to be outputted to the second node, amplifying the voltage difference between the third and fourth nodes, and applying first and second body bias voltages to the first and second pull-up transistors, a bias voltage generating portion generating the first and second bias voltages for adjusting an offset of an electric current flowing through the third and fourth nodes, and a latch portion for latching signals of the first and second nodes to output an output signal and an inverted output signal.

The bias voltage generating portion includes a plurality of resistors and a plurality of output nodes between a third power voltage having a higher level than or equal level to the first power voltage and a fourth power voltage having a level between the first power voltage and the second power voltage, and the first and second body bias voltages are selected in the plurality of output nodes and then outputted.

Another aspect of the present invention is to provide a sense amplifier flip flop, comprising: a pre-charging portion connected between a first power voltage and first and second nodes and pre-charging the first and second nodes to a pre-determined voltage in response to a clock signal, a differential input portion connected between a second power voltage and third and fourth nodes and receiving an input signal and an inverted input signal to generate a voltage difference between the input signal and the inverted input signal to the third and fourth nodes in response to the clock signal, a differential amplifying portion including a first inverter which includes a first pull-up transistor and a first pull-down transistor serial-connected between the first power voltage and the third node and inverts a signal of the second node to be outputted to the first node and a second inverter which includes a second pull-up transistor and a second pull-down transistor serial-connected between the first power voltage and the fourth node and inverts a signal of the first node to be outputted to the second node, amplifying the voltage difference between the third and fourth nodes, and applying first and second body bias voltages to the first and second pull-down transistors, a bias voltage generating portion generating the first and second bias voltages for adjusting an offset of an electric current flowing through the third and fourth nodes, and a latch portion for latching signals of the first and second nodes to output an output signal and an inverted output signal.

The bias voltage generating portion includes a plurality of resistors and a plurality of output nodes between a third power voltage having a lower level than or equal level to the second power voltage and a fourth power voltage having a level between the first power voltage and the second power voltage, and the first and second body bias voltages are selected in the plurality of output nodes and then outputted.

BRIEF DESCRIPTION OF THE DRAWINGS

The above and other features and advantages of the present invention will become more apparent to those of ordinary skill in the art by describing embodiments in detail with reference to the attached drawings in which.

DETAILED DESCRIPTION

Figure 1:
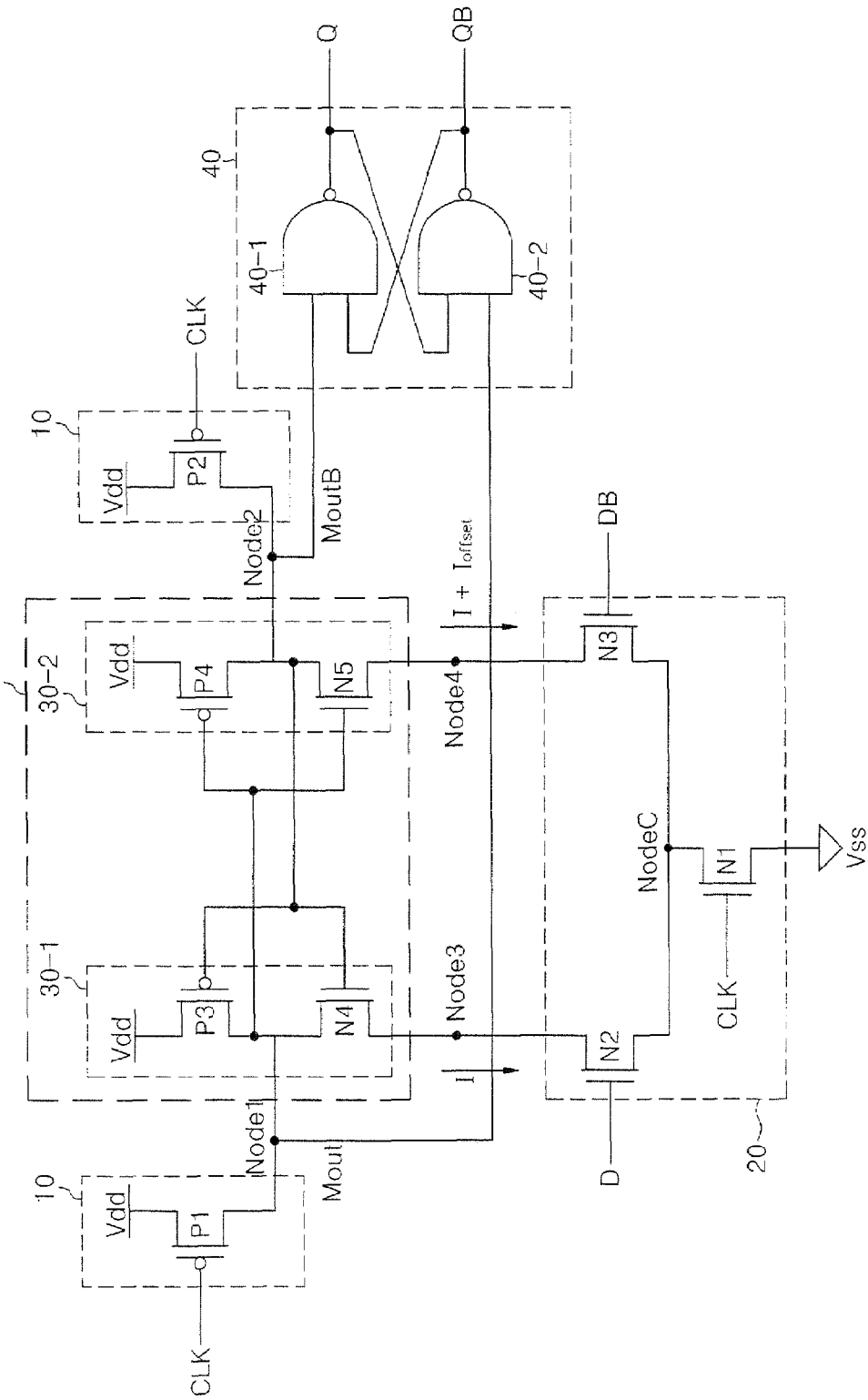
FIG. 1 is a circuit diagram illustrating a first conventional sense amplifier flip flop.
Figure 2:
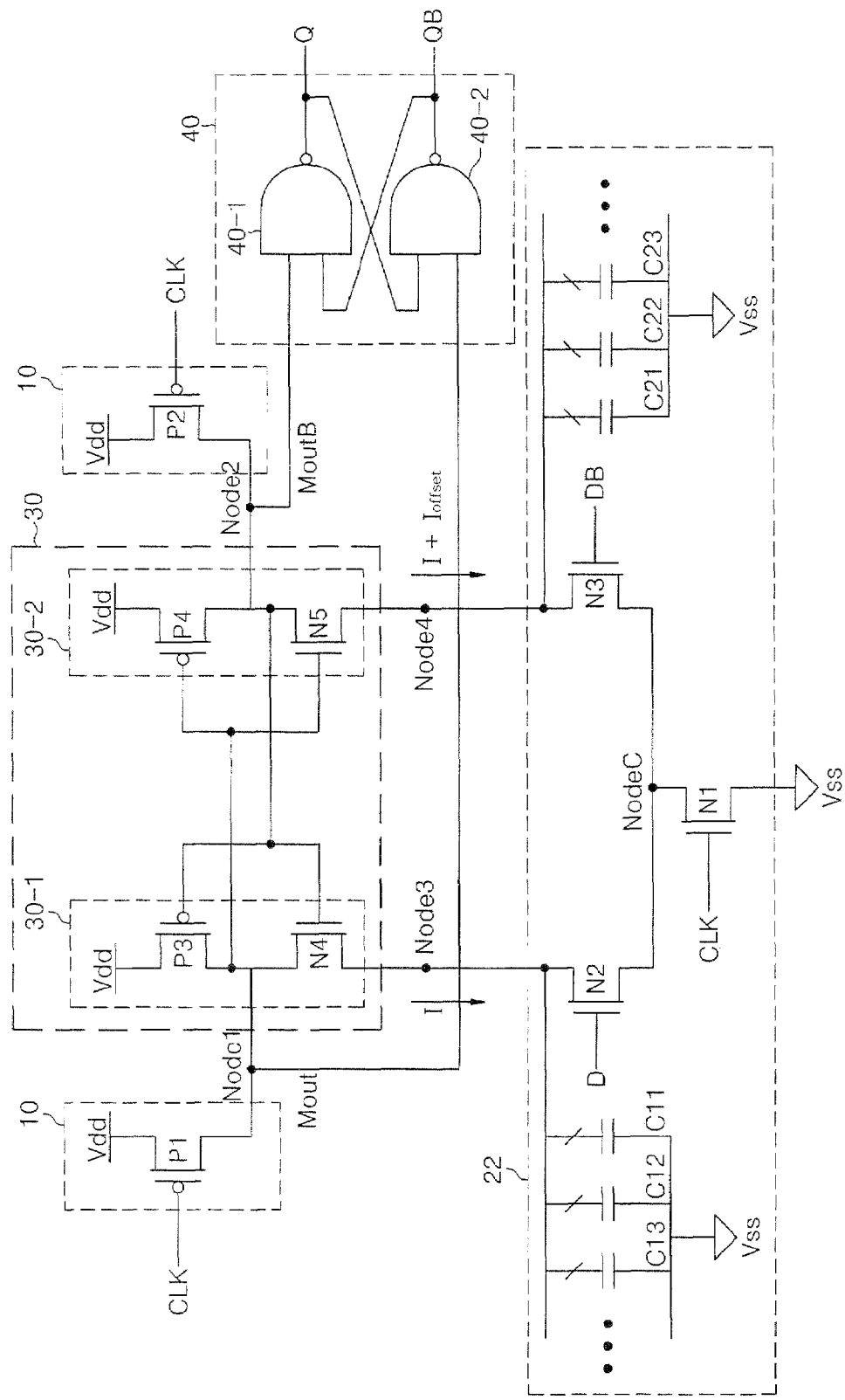
FIG. 2 is a circuit diagram illustrating a second conventional sense amplifier flip flop.
Figure 3:
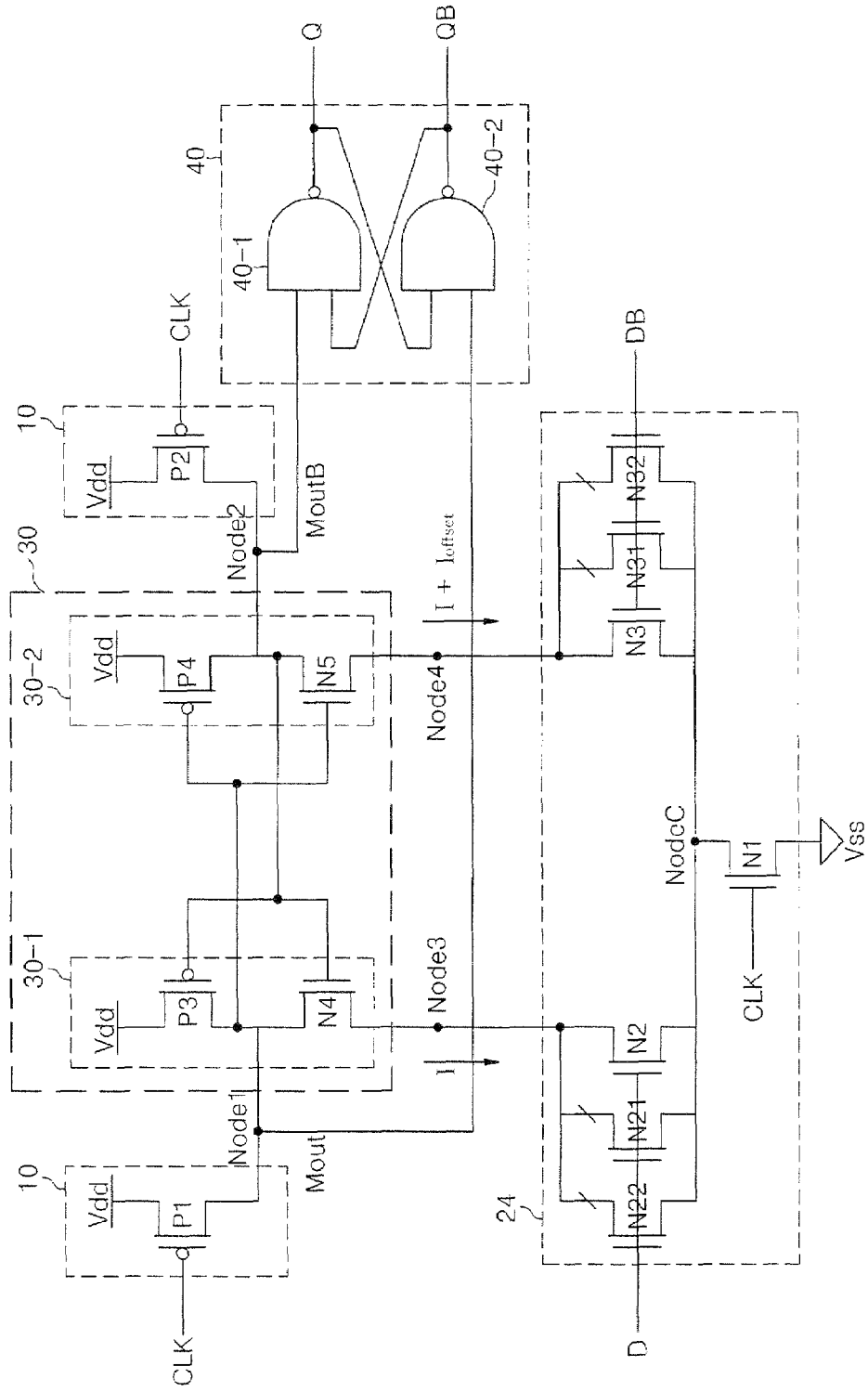
FIG. 3 is a circuit diagram illustrating a third conventional sense amplifier flip flop.

Embodiments will now be described more fully hereinafter with reference to the accompanying drawings. However, embodiments may take different forms and should not be construed as limited to the embodiments set forth herein. Rather, these embodiments are provided so that this disclosure will be thorough and complete, and will fully convey the scope of the following claims to those skilled in the art. In the drawings, the thickness of layers and regions are exaggerated for clarity. Like numbers refer to like elements throughout the specification.

Figure 4:
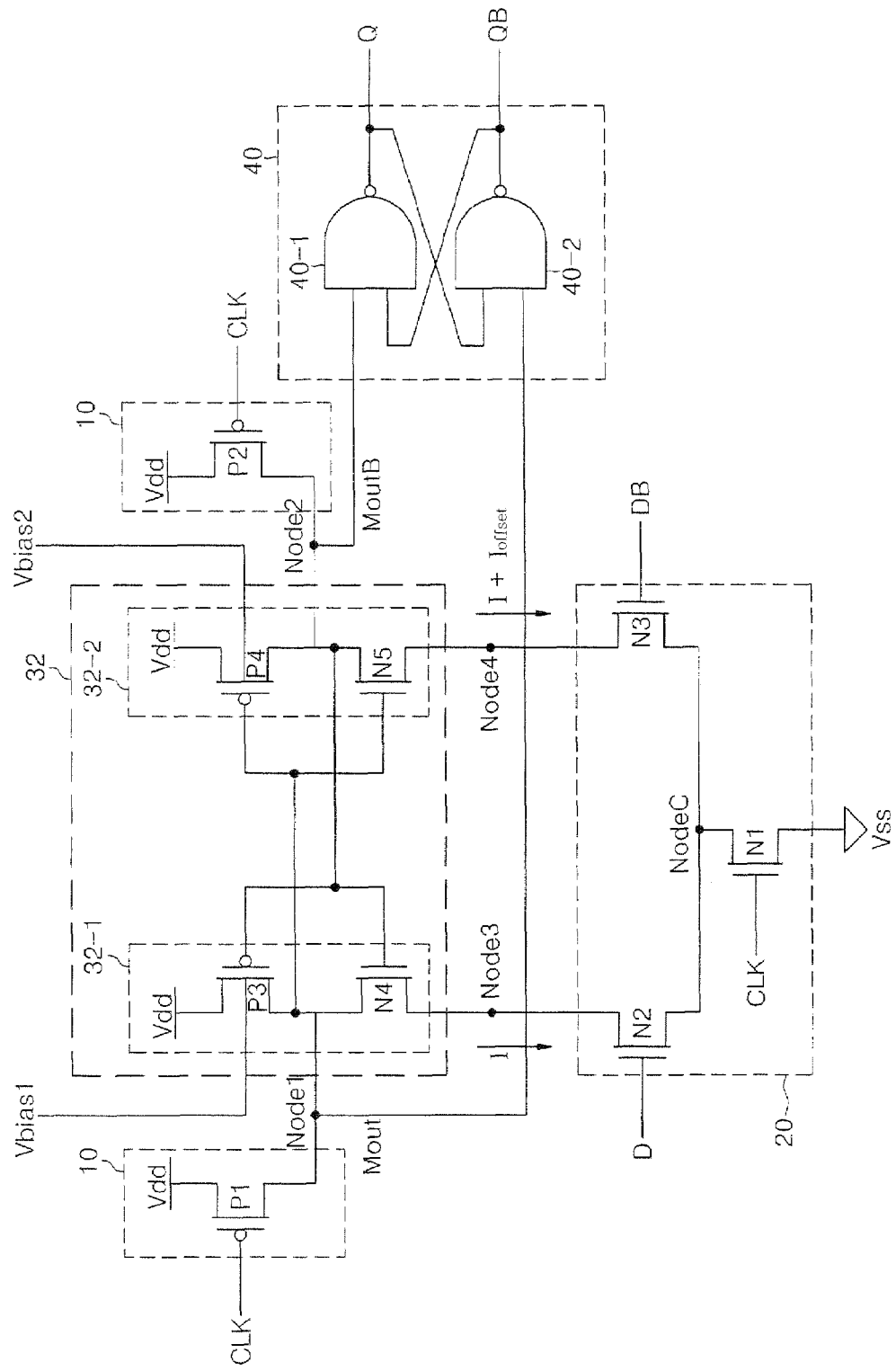
FIG. 4 is a circuit diagram illustrating a sense amplifier flip flop according to a first embodiment.

FIG. 4 is a circuit diagram illustrating a sense amplifier flip flop according to a first embodiment, Referring to FIG. 4, a pre-charging portion 10 includes a PMOS transistor P1 coupled between a power voltage Vdd and a first node Node1, and a PMOS transistor P2 coupled between a power voltage Vdd and a second node Node2. The PMOS transistors P1 and P2 receive a clock signal CLK through their gates and are configured to turn on to pre-charge the first and second nodes Node1 and Node2, respectively, when the clock signal CLK having a low level is applied.

A differential input portion 20 includes an NMOS transistor N1 coupled between a common node NodeC and a ground voltage Vss, and serving as a switch for driving the differential input portion 20 in response to the clock signal CLK, an NMOS transistor N2 coupled between a third node Node3 and the common node NodeC to receive an input signal D, and an NMOS transistor N3 coupled between a fourth node Node4 and the common node NodeC to receive an inverted input signal DB. When the clock signal CLK having a high level is applied, the NMOS transistor N1 is turned on, so that the differential input portion 20 receives the input signal D and the inverted input signal DB, respectively, through the NMOS transistors N2 and N3 to detect a voltage difference between the input signal D and the inverted input signal DB.

A differential amplifying portion 32 includes two inverters, i.e., first and second inverters 32-1 and 32-2. The inputs of the two inverters 32-1 and 32-2 are coupled to the outputs of the other inverters. The inverter 32-1 includes a PMOS transistor P3 and an NMOS transistor N4, and the inverter 32-2 includes a PMOS transistor P4 and an NMOS transistor N5. The PMOS transistor P3 is coupled between the power voltage and the first node Node1, and the PMOS transistor P4 is coupled between the power voltage and the second node Node2. The NMOS transistor N4 is coupled between the first node Node1 and the third node Node3, and the NMOS transistor N5 is coupled between the second node Node2 and the fourth node Node4.

Gates of the PMOS transistor P3 and the NMOS transistor N4 of the first inverter 32-1 are commonly coupled to the second node Node2, and gates of the PMOS transistor P4 and the NMOS transistor N5 of the second inverters 32-2 are commonly coupled to the first node Node1. The PMOS transistor P3 receives a first body bias voltage Vbias1 through its body, and the PMOS transistor P4 receives a second bias body voltage Vbias2 through its body. The first and second body bias voltages Vbias1 and Vbias2 change the threshold voltages of the PMOS transistors P3 and P4 respectively to adjust the offset between the electric current which flows through the third node Node3 and the electric current which flows through the fourth node Node4.

The differential amplifying portion 30 amplifies the voltage difference between the input signal D and the inverted input signal, detected by the differential input portion 20, to output a differential signal Mout and an inverted differential signal MoutB respectively to the first and second nodes Node1 and Node2.

A latch portion 40 includes two NAND gates 40-1 and 40-2. The first NAND gate 40-1 receives the differential signal Mout and an inverted output signal QB, i.e., an output of the second NAND gate 40-2 to output an output signal Q, and the second NAND gate 40-2 receives the inverted differential signal MoutB and an output signal Q, i.e., an output of the first NAND gate 40-1 to output an inverted output signal QB.

The latch portion 40 latches the differential signal Mout and the inverted differential signal MoutB as an SR latch to output the output signal Q and the inverted output signal QB.

An operation of the sense amplifier flip flop of FIG. 4 is described below. When the clock signal CLK having a low level is applied, the PMOS transistors P1 and P2 of the pre-charging portion 10 are turned on, and the NMOS transistor N1 of the differential input portion 20 is turned off. The NMOS transistors N2 and N3 of the differential input portion 20 and the PMOS transistors P3 and P4 and the NMOS transistors N4 and N5 of the differential amplifying portion 32 are also turned off, and the power voltage Vdd is applied to pre-charge the first and second nodes Node1 and Node2. The latch portion 40 maintains the output signal Q and the inverted output signal QB in a previous state since the differential signal Mout and the inverted differential signal MoutB are output at a high level from the first and second nodes Node1 and Node2.

When the clock signal CLK having a high level is applied, the PMOS transistors P1 and P2 of the pre-charging portion 10 are turned off, and the NMOS transistor N1 of the differential input portion 20 is turned on.

When the NMOS transistor N1 is turned on, the NMOS transistors N2 and N3 of the differential input portion 20 receive the input signal D and the inverted input signal DB via their gates so that the voltage difference between the two signals D and DB is detected.

When the input signal D having a high level is applied to the gate of the NMOS transistor N2, the inverted input signal DB having a low level is applied to the gate of the NMOS transistor N3. As a result, the NMOS transistor N2 is turned on, the NMOS transistor N3 is turned off, the NMOS transistor N4 of the differential amplifying portion 32 coupled to the NMOS transistor N2 is turned on, and the voltage level of the first node Node1 which is pre-charged is lowered. Thus, the NMOS transistor N5 is turned off.

Since the PMOS transistor P3 is turned off, and the NMOS transistors N1, N2 and N4 are turned on, the voltage level of the first node Node1 is lowered, so that the differential signal Mout is output at a low level. Also, since the PMOS transistor P4 is turned on and the NMOS transistors N3 and N5 are turned off, the second node Node2 is maintained at the pre-charged voltage level, so that the inverted differential signal MoutB is output at a high level.

The latch portion 40 receives and latches the differential signal Mout output from the first node Node1 and the inverted differential signal MoutB output from the second node Node2 to output the output signal Q having a low level and the inverted output signal QB having a high level.

When the input signal D having a low level is applied to the gate of the NMOS transistor N2, the inverted input signal DB having a high level is applied to the gate of the NMOS transistor N3.

The NMOS transistor N2 is turned off, and the NMOS transistor N3 is turned on. Thus, the NMOS transistor N4 of the differential amplifying portion 32 coupled to the NMOS transistor N2 is turned off, and the NMOS transistor N5 is turned on. When the NMOS transistor N5 is turned on, the voltage level of the pre-charged second node Node2 is lowered.

With respect to the first node Node1, since the PMOS transistor P3 is turned on and the NMOS transistors N2 and N4 are turned off, the pre-charged voltage level is maintained, and the differential signal Mout is output at a high level.

With respect to the second node Node2, since the PMOS transistor P4 is turned off and the NMOS transistors N1, N3 and N5 are turned on, the voltage level is lowered, and the inverted differential signal MoutB is output at a low level.

The latch portion receives and latches the differential signal Mout output from the first node Node1 and the inverted differential signal MoutB output from the second node Node2 to output the output signal Q having a high level and the inverted output signal QB having a low level.

However, the operation of the sense amplifier flip flop of FIG. 4 described above is an operation of a case where there is no offset. In order to detect the offset of the sense amplifier flip flop of FIG. 4, if the current $I+I_{offset}$ flowing through the fourth node Node4 is greater than the current I flowing through the third node Node3 by the offset current $I_{offset}$ when the input signal D and the inverted input signal DB are respectively applied at a high level to the NMOS transistors N2 and N3, the first body bias voltage Vbias1 is applied to the PMOS transistor P3 of the differential amplifying portion 32, and the second body bias voltage Vbias2 is applied to the PMOS transistor P4. The first and second body bias voltages Vbias1 and Vbias2 may be positive, and thus the threshold voltages of the PMOS transistors P3 and P4 are increased. As a result, the current which flows to the drains of the PMOS transistors P3 and P4 may be reduced. Since the current $I+I_{offset}$ flowing through the fourth node Node4 is greater by the offset current $I_{offset}$, the second body bias voltage Vbias2 is set to be higher than the first body bias voltage Vbias1 so that the threshold voltage Vth of the PMOS transistor P4 is higher than the threshold voltage Vth of the PMOS transistor P3.

The threshold voltage of the NMOS transistor is increased in proportion to a square root of the body bias voltage. In a saturation region, the current flowing to the drain of the NMOS transistor is in proportion to the square of the threshold voltage Vth.

Accordingly, the offset of the sense amplifier flip flop is adjusted by adjusting the first and second body bias voltages Vbias1 and Vbias2 respectively applied to the bodies of the PMOS transistors P3 and P4 of the differential amplifying portion 32.

In order to adjust the offset, the above-described embodiment applies the body bias voltages Vbias1 and Vbias2 respectively to the PMOS transistors P3 and P4. However, the body bias voltage can be applied to only one of the PMOS transistors P3 and P4. For example, the second body bias voltage Vbias2 applied to the PMOS transistor P4 is adjusted higher when the current flowing through the fourth node Node4 is much, whereas the second body bias voltage Vbias2 applied to the PMOS transistor P4 is adjusted lower when the current flowing through the fourth node Node4 is small.

Figure 5:
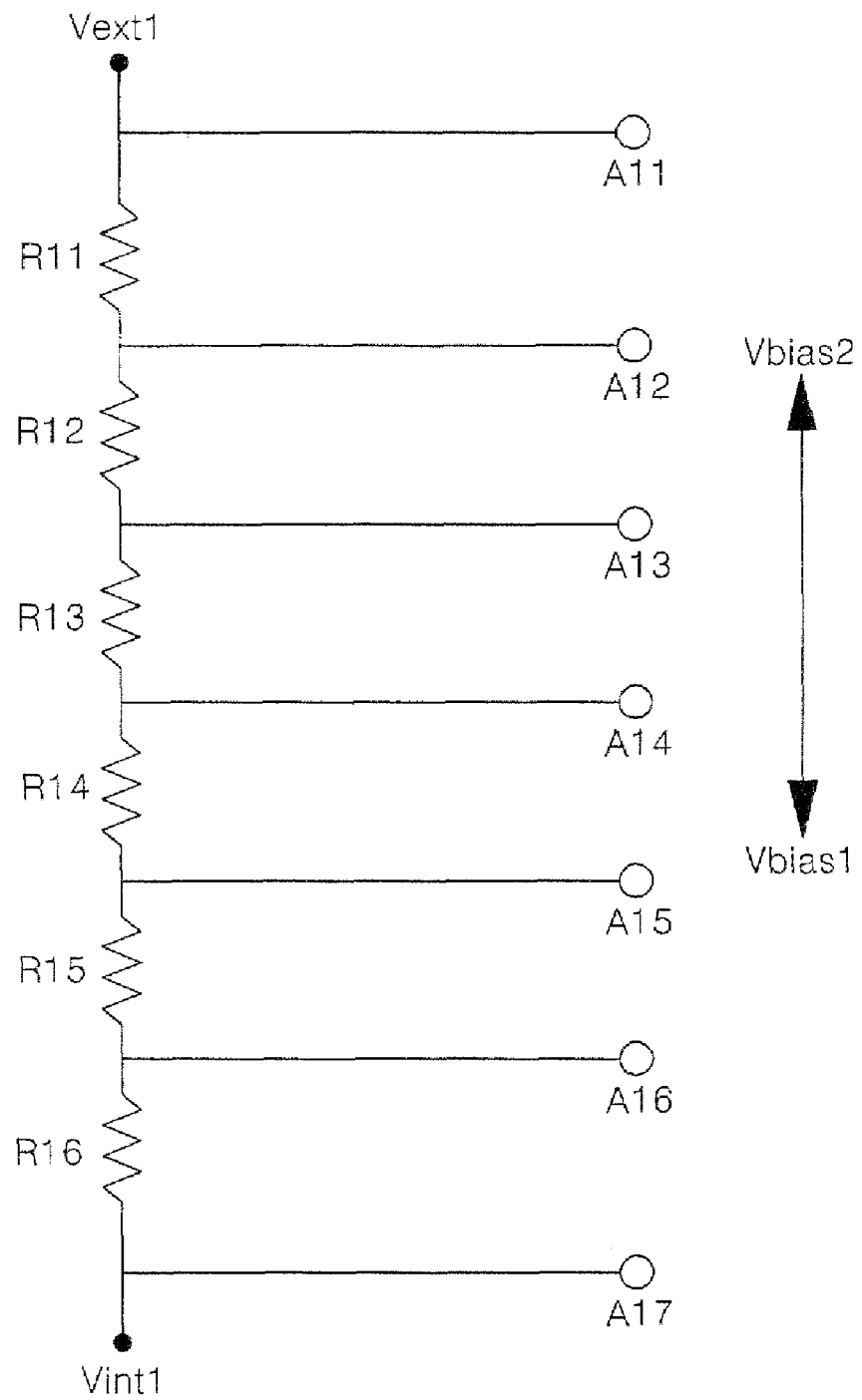
FIG. 5 is a circuit diagram illustrating a first bias voltage generating portion which generates the first and second body bias voltages of FIG. 4.

FIG. 5 is a circuit diagram illustrating a first bias voltage generating portion which generates the first and second body bias voltages of FIG. 4.

In an embodiment, the first bias voltage generating portion includes a resistor network. The sense amplifier flip flop is part of a DRAM. The DRAM has an external voltage that is applied from an external portion, and an internal voltage that is internally generated. Here, a first external voltage Vext1 is higher than a first internal voltage Vint1, and the power voltage Vdd of FIG. 4 can be used as the first internal voltage Vint1. The first bias voltage generating portion includes multiple resistors R11 to R16 coupled between the first external voltage Vext1 and the first internal voltage Vint1 and outputs the bias voltage to output terminals A11 to A17 respectively coupled between the resistors R11 to R16.

Although the first external voltage Vext1 has been described as higher than the first internal voltage Vint1, such voltages may have any relationship as desired to create the desired bias voltages. In addition, although the first external voltage Vext1 has been described as being generated external to the DRAM, and the first internal voltage Vint1 has been described as being internally generated, both voltages may be internally or externally generated as desired.

The greater the number of the resistors arranged between the first external voltage Vext1 and the first internal voltage Vint1 is, the more precisely the voltage is adjusted.

As a voltage used to adjust the offset of the sense amplifier flip flop of FIG. 4, the first body bias voltage Vbias1 and the second body bias voltage Vbias2 are selected in the output terminals A11 to A17 and then applied to the PMOS transistors P3 and P4.

Figure 6:
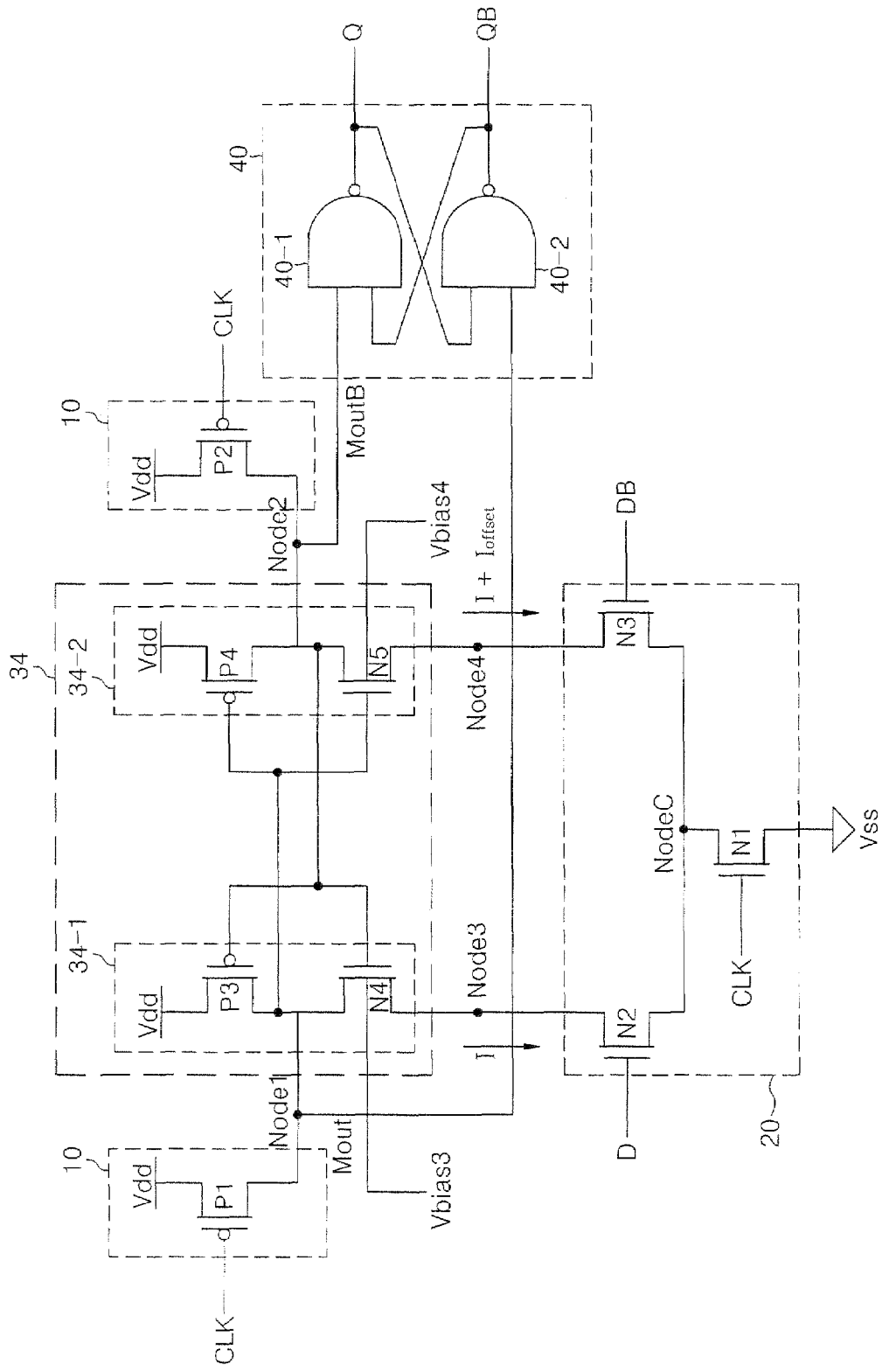
FIG. 6 is a circuit diagram illustrating a sense amplifier flip flop according to a second embodiment.

FIG. 6 is a circuit diagram illustrating a sense amplifier flip flop according to a second embodiment.

The sense amplifier flip flop of FIG. 4 adjusts the offset by applying the first and second body bias voltages to the bodies of the PMOS transistors P3 and P4 of the differential amplifying portion 32, whereas the sense amplifier flip flop of FIG. 6 adjusts the offset by applying third and fourth body bias voltages to the bodies of the NMOS transistors N4 and N5 of the differential amplifying portion 34.

In order to detect the offset of the sense amplifier flip flop of FIG. 6, if the current $I+I_{offset}$ flowing through the fourth node Node4 is greater than the current I flowing through the third node Node3 by the offset current $I_{offset}$, when the input signal D and the inverted input signal DB are respectively applied at a high level to the NMOS transistors N2 and N3, the third body bias voltage Vbias3 is applied to the NMOS transistor N4 of the differential amplifying portion 34, and the fourth body bias voltage Vbias4 is applied to the NMOS transistor N5. The third and fourth body bias voltages Vbias3 and Vbias4 may be negative, and the threshold voltages of the NMOS transistors N4 and N5 are increased, which reduces the current which flows to the sources of the NMOS transistors N4 and N5. Since the $I+I_{offset}$ flowing through the fourth node Node4 flows more by the offset current $I_{offset}$, the fourth body bias voltage Vbias4 is set to be lower than the third body bias voltage Vbias3 so that the threshold voltage Vth of the NMOS transistor N5 is higher than the threshold voltage Vth of the NMOS transistor N4.

Accordingly, the offset of the sense amplifier flip flop is adjusted by adjusting the third and fourth body bias voltages Vbias3 and Vbias4 respectively applied to the bodies of the NMOS transistors N4 and N5 of the differential amplifying portion 34.

In order to adjust the offset, the above-described embodiment applies the body bias voltages Vbias3 and Vbias4 respectively to the NMOS transistors N4 and N5. However, the body bias voltage can be applied to only one of the NMOS transistors N4 and N5. That is, the fourth body bias voltage Vbias4 applied to the NMOS transistor N5 is adjusted lower when the current flowing through the fourth node Node4 is much, whereas the third body bias voltage Vbias4 applied to the NMOS transistor N5 is adjusted higher when the current flowing through the fourth node Node4 is small.

Figure 7:
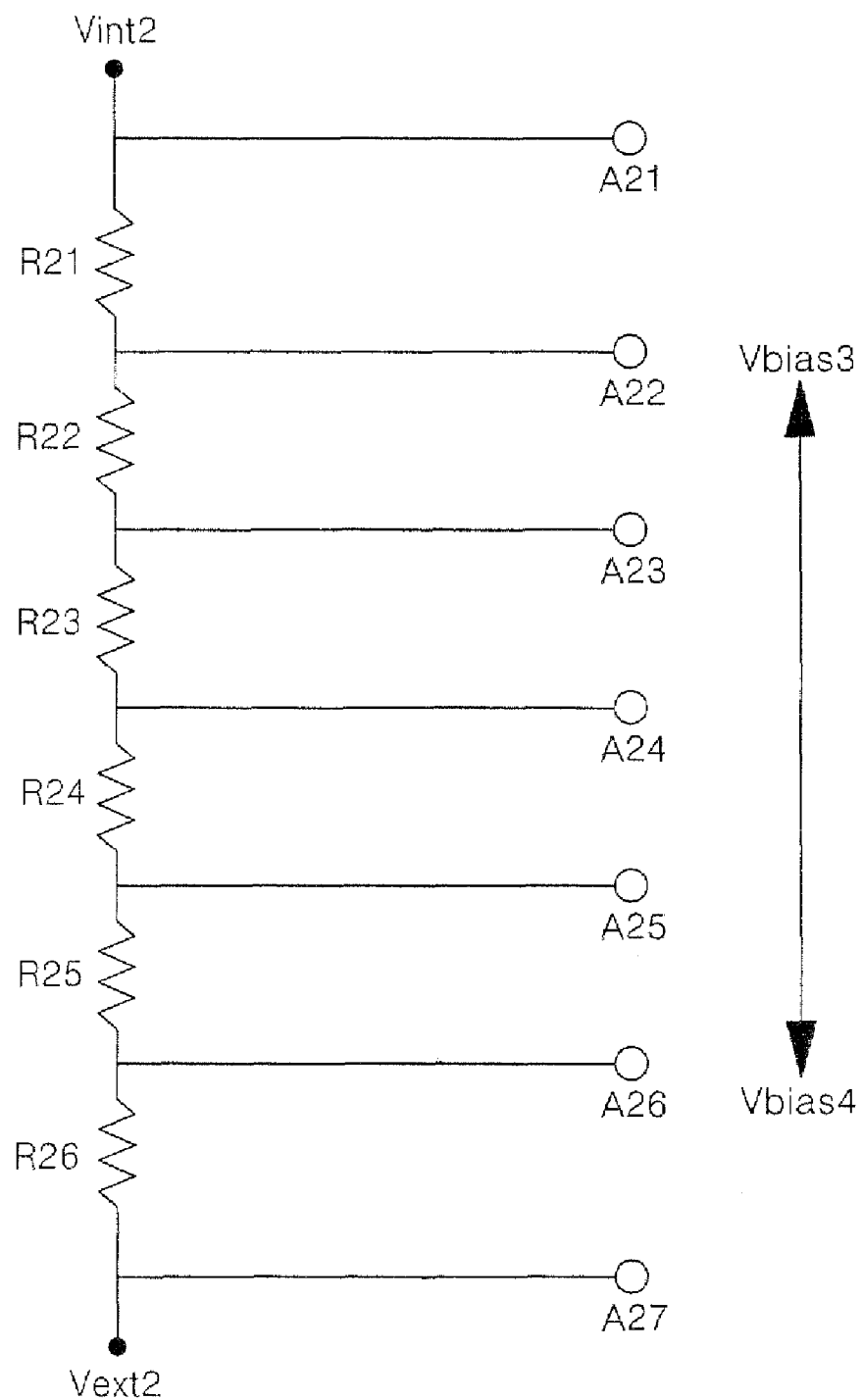
FIG. 7 is a circuit diagram illustrating a second bias voltage generating portion which generates the third and fourth body bias voltages of FIG. 6.

FIG. 7 is a circuit diagram illustrating a second bias voltage generating portion which generates the third and fourth body bias voltages of FIG. 6.

In FIG. 7, a second external voltage Vext2 is lower than a second internal voltage Vint2, and the ground voltage Vss of FIG. 4 can be used as the second internal voltage Vint2. The second bias voltage generating portion includes multiple resistors R21 to R26 coupled between the second external voltage Vext2 and the second internal voltage Vint2 and outputs the bias voltage to output terminals A21 to A27 respectively coupled between the resistors R21 to R26.

The greater the number of the resistors arranged between the second external voltage Vext2 and the second internal voltage Vint2 is, the more precisely the voltage is adjusted.

As a voltage necessary to adjust the offset of the sense amplifier flip flop of FIG. 6, the third body bias voltage Vbias3 and the fourth body bias voltage Vbias4 are selected in the output terminals A21 to A27 and then applied to the NMOS transistors N4 and N5.

Similar to the bias voltage generating portion described in FIG. 5, the voltage Vext2 and the voltage Vint2, may be any voltage from any source as desired.

Figure 8:
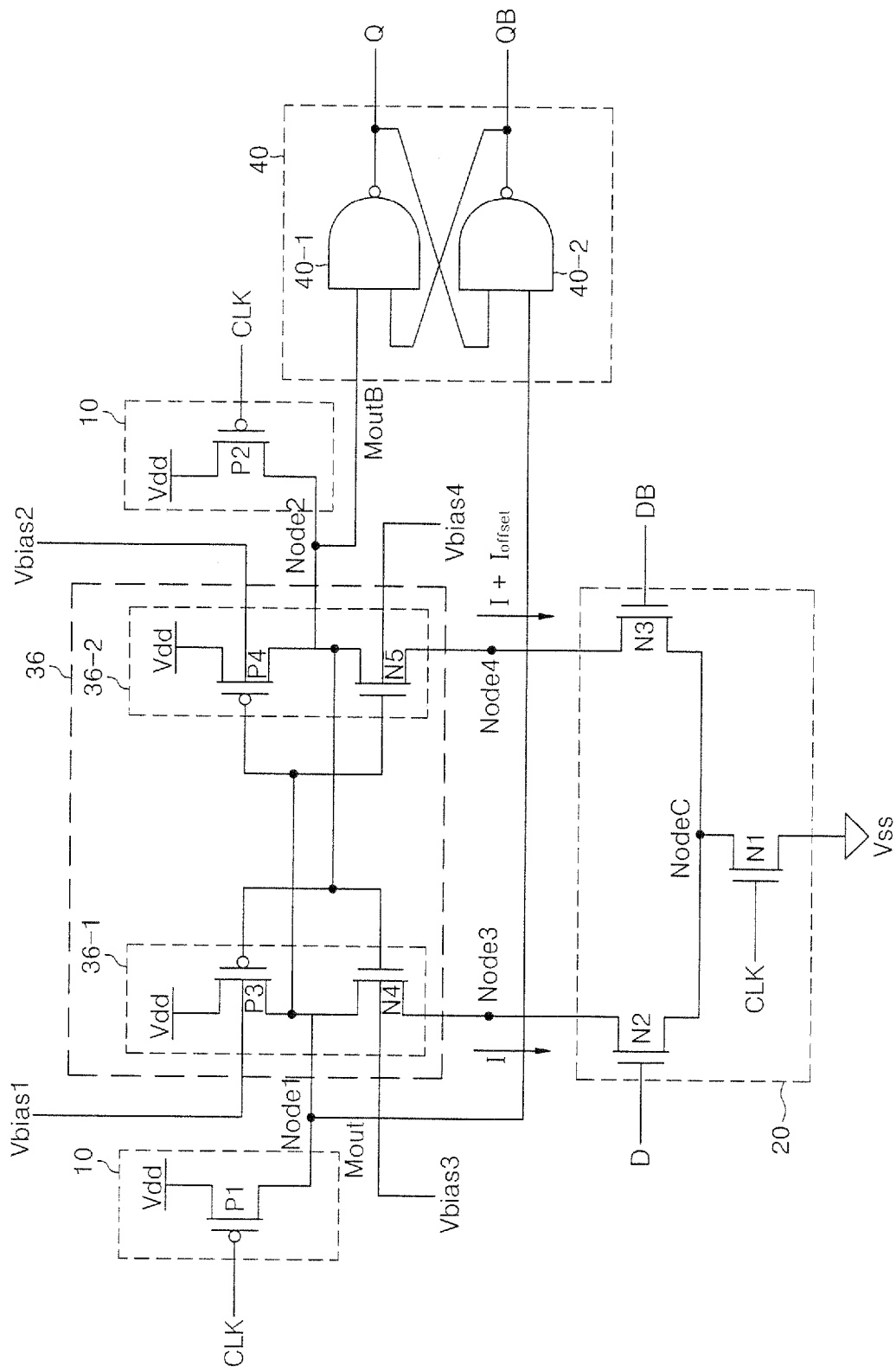
FIG. 8 is a circuit diagram illustrating a sense amplifier flip flop according to a third embodiment.

FIG. 8 is a circuit diagram illustrating a sense amplifier flip flop according to a third embodiment. The sense amplifier flip flops of FIGS. 4 and 6 adjust the offset by applying the first and second body bias voltages to the bodies of the PMOS transistors P3 and P4 of the differential amplifying portion 32 or by applying the third and fourth body bias voltages to the bodies of the NMOS transistors N4 and N5 of the differential amplifying portion 34, respectively. However, the sense amplifier flip flop of FIG. 8 adjusts the offset by applying the first and second body bias voltages to the bodies of the PMOS transistors P3 and P4 of the differential amplifying portion 36 and applying the third and fourth body bias voltages to the bodies of the NMOS transistors N4 and N5 of the differential amplifying portion 36.

In order to detect the offset of the sense amplifier flip flop of FIG. 8, if the current $I+I_{offset}$ flowing through the fourth node Node4 is greater than the current I flowing through the third node Node3 by the offset current $I_{offset}$, when the input signal D and the inverted input signal DB are respectively applied at a high level to the NMOS transistors N2 and N3, the first body bias voltage Vbias1 is applied to the PMOS transistor P3, the second body bias voltage Vbias2 is applied to the PMOS transistor P4, the third body bias voltage Vbias3 is applied to the NMOS transistor N4, and the fourth body bias voltage Vbias4 is applied to the NMOS transistor N5. The first and second body bias voltages Vbias1 and Vbias2 may be positive, and the threshold voltages of the PMOS transistors P3 and P4 are increased, which reduces the current which flows to the drains of the PMOS transistors P3 and P4. The third and fourth body bias voltages Vbias3 and Vbias4 may be negative, and the threshold voltages of the NMOS transistors N4 and N5 are increased, which reduces the current which flows to the sources of the NMOS transistors N4 and N5. Since the current $I+I_{offset}$ flowing through the fourth node Node4 is greater by the offset current $I_{offset}$, the second body bias voltage Vbias2 is set to be higher than the first body bias voltage Vbias1 so that the threshold voltage Vth of the PMOS transistor P4 is higher than the threshold voltage Vth of the PMOS transistor P3, and the fourth body bias voltage Vbias4 is set to be lower than the third body bias voltage Vbias3 so that the threshold voltage Vth of the NMOS transistor N5 is higher than the threshold voltage Vth of the NMOS transistor N4.

Accordingly, the offset of the sense amplifier flip flop is adjusted by adjusting the first and second body bias voltages Vbias1 and Vbias2 respectively applied to the bodies of the PMOS transistors P3 and P4 of the differential amplifying portion 36 and the third and fourth body bias voltages Vbias3 and Vbias4 respectively applied to the bodies of the NMOS transistors N4 and N5.

In order to adjust the offset, the above-described embodiment applies the body bias voltages Vbias1 and Vbias2 respectively to the PMOS transistors P3 and P4, and applies the body bias voltages Vbias3 and Vbias4 respectively to the NMOS transistors N4 and N5, but one or more of the body bias voltages can be applied to corresponding one or more of the PMOS transistors P3 and P4 and the NMOS transistors N4 and N5. That is, the second body bias voltage Vbias2 applied to the PMOS transistor P4 is adjusted higher or the fourth body bias voltage Vbias4 applied to the NMOS transistor N5 is adjusted lower when the current flowing through the fourth node Node4 is much, whereas the second body bias voltage Vbias2 applied to the PMOS transistor P4 is adjusted lower or the fourth body bias voltage Vbias4 applied to the NMOS transistor N5 is adjusted higher when the current flowing through the fourth node Node4 is small.

In FIG. 8, the first and second body bias voltages Vbias1 and Vbias2 are generated by the first bias voltage generating portion of FIG. 5, and the third and fourth body bias voltages Vbias3 and Vbias4 are generated by the second bias voltage generating portion of FIG. 7.

As described above, the sense amplifier flip flop which adjusts the offset according to an embodiment includes the pre-charging portion, the differential input portion, the differential amplifying portion, and the latch portion, and adjusts the offset by applying the body bias voltage to the body of the MOS transistor of the differential amplifying portion to adjust the threshold voltage of the MOS transistor. Thus, it is easy to design, and the layout area size is small, and the offset of the sense amplifier flip flop can be adjusted without fuse cutting.

Although particular embodiments have been described, one skilled in the art will understand that various modifications may be made without departing from the spirit and scope of the following claims.

What is claimed is:

1. A sense amplifier flip flop, comprising:
   a pre-charging portion connected between a first power voltage and first and second nodes and pre-charging the first and second nodes to a predetermined voltage in response to a clock signal;
   a differential input portion connected between a second power voltage and third and fourth nodes and receiving an input signal and an inverted input signal to generate a voltage difference between the input signal and the inverted input signal to the third and fourth nodes in response to the clock signal;
   a differential amplifying portion including a first inverter which includes a first pull-up transistor and a first pull-down transistor serial-connected between the first power voltage and the third node and inverts a signal of the second node to be outputted to the first node and a second inverter which includes a second pull-up transistor and a second pull-down transistor serial-connected between the first power voltage and the fourth node and inverts a signal of the first node to be outputted to the second node, amplifying the voltage difference between the third and fourth nodes, and applying first and second body bias voltages to bodies of the first and second pull-up transistors;
   a bias voltage generating portion generating the first and second body bias voltages for adjusting an offset of an electric current flowing through the third and fourth nodes; and
   a latch portion for latching signals of the first and second nodes to output an output signal and an inverted output signal;
   wherein the bias voltage generating portion includes a plurality of resistors and a plurality of output nodes between a third power voltage having a higher level than or equal level to the first power voltage and a fourth power voltage having a level between the first power voltage and the second power voltage, and the first and second body bias voltages are selected in the plurality of output nodes and then outputted.

2. The flip flop of claim 1, wherein the pre-charging portion includes
   a first PMOS transistor connected between the first power voltage and the first node and receiving the clock signal via its gate; and
   a second PMOS transistor connected between the first power voltage and the second node and receiving the clock signal via its gate.

3. The flip flop of claim 1, wherein the differential input portion includes
   a first NMOS transistor connected between a common node and the second power voltage and receiving the clock signal via its gate;
   a second NMOS transistor connected between a common node and the third node and receiving the input signal via its gate; and
   a third NMOS transistor connected between a common node and the fourth node and receiving the inverted input signal via its gate.

4. The flip flop of claim 1, wherein the first inverter includes
   a PMOS transistor connected between the first power voltage and the first node as the first pull-up transistor, connected to the second node via its gate, and receiving the first body bias voltage via its body; and
   an NMOS transistor connected between the first node and the third node as the first pull-down transistor and connected to the second node via its gate.

5. The flip flop of claim 1, wherein the second inverter includes
   a PMOS transistor connected between the first power voltage and the second node as the second pull-up transistor, connected to the first node via its gate, and receiving the second body bias voltage via its body; and
   an NMOS transistor connected between the second node and the fourth node as the second pull-down transistor and connected to the first node via its gate.

6. The flip flop of claim 1, wherein the latch portion is a SR latch having two NAND gates.

7. The flip flop of claim 1, wherein the differential amplifying portion is configured such that third and fourth body bias voltages are applied to bodies of the first and second pull-down transistors.

8. The flip flop of claim 7, wherein the bias voltage generating portion further generates the third and fourth bias voltages that can be independently varied for adjusting the offset of the current flowing through the third and fourth nodes.

9. A sense amplifier flip flop, comprising:
   a pre-charging portion connected between a first power voltage and first and second nodes and pre-charging the first and second nodes to a predetermined voltage in response to a clock signal;
   a differential input portion connected between a second power voltage and third and fourth nodes and receiving an input signal and an inverted input signal to generate a voltage difference between the input signal and the inverted input signal to the third and fourth nodes in response to the clock signal;

a differential amplifying portion including a first inverter which includes a first pull-up transistor and a first pull-down transistor serial-connected between the first power voltage and the third node and inverts a signal of the second node to be outputted to the first node and a second inverter which includes a second pull-up transistor and a second pull-down transistor serial-connected between the first power voltage and the fourth node and inverts a signal of the first node to be outputted to the second node, amplifying the voltage difference between the third and fourth nodes, and applying first and second body bias voltages to bodies of the first and second pull-down transistors;

a bias voltage generating portion generating the first and second bias voltages for adjusting an offset of an electric current flowing through the third and fourth nodes; and a latch portion for latching signals of the first and second nodes to output an output signal and an inverted output signal;

wherein the bias voltage generating portion includes a plurality of resistors and a plurality of output nodes between a third power voltage having a lower level than or equal level to the second power voltage and a fourth power voltage having a level between the first power voltage and the second power voltage, and the first and second body bias voltages are selected in the plurality of output nodes and then outputted.

10. The flip flop of claim 9, wherein the pre-charging portion includes
a first PMOS transistor connected between the first power voltage and the first node and receiving the clock signal via its gate; and
a second PMOS transistor connected between the first power voltage and the second node and receiving the clock signal via its gate.

11. The flip flop of claim 9, wherein the differential input portion includes
a first NMOS transistor connected between a common node and the second power voltage and receiving the clock signal via its gate;
a second NMOS transistor connected between a common node and the third node and receiving the input signal via its gate; and
a third NMOS transistor connected between a common node and the fourth node and receiving the inverted input signal via its gate.

12. The flip flop of claim 9, wherein the first inverter includes
a PMOS transistor connected between the first power voltage and the first node as the first pull-up transistor and connected to the second node via its gate; and
an NMOS transistor connected between the first node and the third node as the first pull-down transistor, connected to the second node via its gate, and receiving the first body bias voltage via its body.

13. The flip flop of claim 9, wherein the second inverter includes
a PMOS transistor connected between the first power voltage and the second node as the second pull-up transistor and connected to the first node via its gate; and
an NMOS transistor connected between the second node and the fourth node as the second pull-down transistor, connected to the first node via its gate, and receiving the second body bias voltage via its body.

14. The flip flop of claim 9, wherein the latch portion is a SR latch having two NAND gates.

15. A sense amplifier flip flop, comprising:
a differential input portion configured to generate a voltage difference on a first node and a second node in response to an input signal, an inverted input signal, and a clock signal;
a differential amplifying portion including:
a first inverter having a first transistor of a first type and a first transistor of a second type serially coupled between a power supply and the third node; and
a second inverter having a second transistor of the first type and a second transistor of the second type serially coupled between the power supply and the fourth node; and
a bias voltage generating portion configured to generate a first body bias voltage and a second body bias voltage;
wherein:
a body of the first transistor of the first type is coupled to the bias voltage generating portion to receive the first body bias voltage;
a body of the second transistor of the first type is coupled to the bias voltage generating portion to receive the second body bias voltage;
the bias voltage generating portion is configured such that the first body bias voltage and the second body bias voltage can be different;
the bias voltage generating portion is configured to generate a third body bias voltage and a fourth body bias voltage;
a body of the first transistor of the second type is coupled to the bias voltage generating portion to receive the third body bias voltage;
a body of the second transistor of the second type is coupled to the bias voltage generating portion to receive the fourth body bias voltage; and
the third body bias voltage and the fourth body bias voltage can be independently varied.

16. The sense amplifier flip flop of claim 15, wherein the bias voltage generating portion includes a first plurality of resistors and a first plurality of output nodes between a third power voltage having a higher level than or equal level to a first power voltage and a fourth power voltage having a level between the first power voltage and a second power voltage, and the first and second body bias voltages are selected in the first plurality of output nodes and then outputted.

17. The sense amplifier flip flop of claim 16, wherein the bias voltage generating portion includes a second plurality of resistors and a second plurality of output nodes between a fifth power voltage having a lower level than or equal level to the second power voltage and a sixth power voltage having a level between the first power voltage and the second power voltage, the third and fourth body bias voltages selected in the second plurality of output nodes and then outputted.

* * * * *

UNITED STATES PATENT AND TRADEMARK OFFICE
CERTIFICATE OF CORRECTION

PATENT NO. : 7,479,818 B2  
APPLICATION NO. : 11/552102  
DATED : January 20, 2009  
INVENTOR(S) : Min-Ho Park et al.

Page 1 of 1

It is certified that error appears in the above-identified patent and that said Letters Patent is hereby corrected as shown below:

Column 3, line 67, the words "offset is" should read -- $I_{offset}$ --.

Signed and Sealed this

First Day of September, 2009

David J. Kappos  
*Director of the United States Patent and Trademark Office*